United States Patent
Mehnert

(10) Patent No.: US 10,194,495 B2
(45) Date of Patent: Jan. 29, 2019

(54) METHOD FOR ADDRESSING MISALIGNMENT OF LEDS ON A PRINTED CIRCUIT BOARD

(71) Applicant: Lumileds LLC, San Jose, CA (US)

(72) Inventor: Axel Mehnert, Mountain View, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/849,384

(22) Filed: Dec. 20, 2017

(65) Prior Publication Data

US 2018/0177007 A1 Jun. 21, 2018

Related U.S. Application Data

(60) Provisional application No. 62/437,593, filed on Dec. 21, 2016.

(51) Int. Cl.
| | |
|---|---|
| *F21V 14/00* | (2018.01) |
| *H05B 33/08* | (2006.01) |
| *H05K 1/02* | (2006.01) |
| *H05K 3/30* | (2006.01) |

(Continued)

(52) U.S. Cl.
CPC ........ *H05B 33/0803* (2013.01); *F21S 41/153* (2018.01); *F21S 41/19* (2018.01); *H05K 1/0274* (2013.01); *H05K 3/303* (2013.01); *H05K 2201/09063* (2013.01); *H05K 2201/10106* (2013.01); *H05K 2203/166* (2013.01)

(58) Field of Classification Search
CPC .... H05B 33/0803; F21S 41/153; F21S 41/19; H05K 3/303; H05K 1/0274; H05K 2201/10106; H05K 2201/09063; H05K 2203/166

See application file for complete search history.

(56) References Cited

U.S. PATENT DOCUMENTS

| | | | |
|---|---|---|---|
| 5,040,868 A * | 8/1991 | Waitl | G02B 6/4202 257/701 |
| 7,348,604 B2 * | 3/2008 | Matheson | F21V 15/01 257/98 |
| 7,638,814 B2 | 12/2009 | Wall, Jr. et al. | |

(Continued)

FOREIGN PATENT DOCUMENTS

| | | |
|---|---|---|
| WO | 2016/094913 A1 | 6/2016 |
| WO | 2016/150913 | 9/2016 |

*Primary Examiner* — Ali Alavi

(74) *Attorney, Agent, or Firm* — Volpe and Koenig, PC

(57) ABSTRACT

LEDs for an illumination system may be mounted on a PCB. The PCB may be provided with alignment features such as oversized holes for connection to a support surface. Using optical sensing of the position of the mounted LEDs, the space made available by the alignment features may be reduced and aligned to create modified alignment features. The modified alignment features may be created by adding a modifying component and aligned based on the sensed positions of the mounted LEDs. The positioning of the modifying component may offset misalignment of the LEDs with the PCB. An opening in the modified alignment feature may receive a bolt or alignment pin for connection to the support surface. The support surface may be aligned with the secondary optics, resulting in the LEDs being aligned with the secondary optics irrespective of misalignment of the LEDs with respect to the PCB.

20 Claims, 7 Drawing Sheets

(51) Int. Cl.
*F21S 41/19* (2018.01)
*F21S 41/153* (2018.01)

(56) References Cited

U.S. PATENT DOCUMENTS

| | | |
|---|---|---|
| 8,025,507 B2 | 9/2011 | Kim et al. |
| 8,162,508 B2 | 4/2012 | Murakoshi et al. |
| 8,683,683 B2 | 4/2014 | Knoll et al. |
| 2008/0239716 A1* | 10/2008 | Lin ................ F21S 4/26 362/219 |
| 2012/0268957 A1 | 10/2012 | Premysler |
| 2014/0001498 A1 | 1/2014 | Cooijmans |
| 2015/0062933 A1 | 3/2015 | Yagi et al. |
| 2015/0228549 A1 | 8/2015 | Mattina et al. |
| 2016/0344118 A1 | 11/2016 | Hsieh et al. |

* cited by examiner

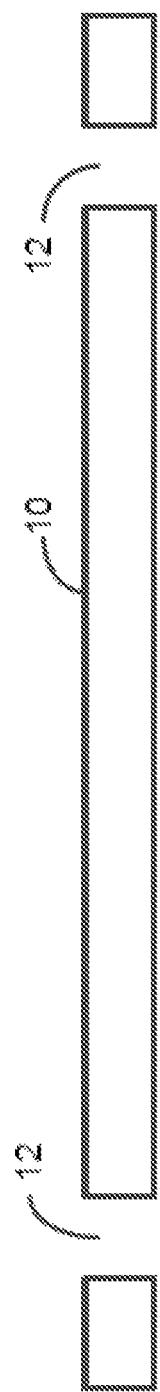
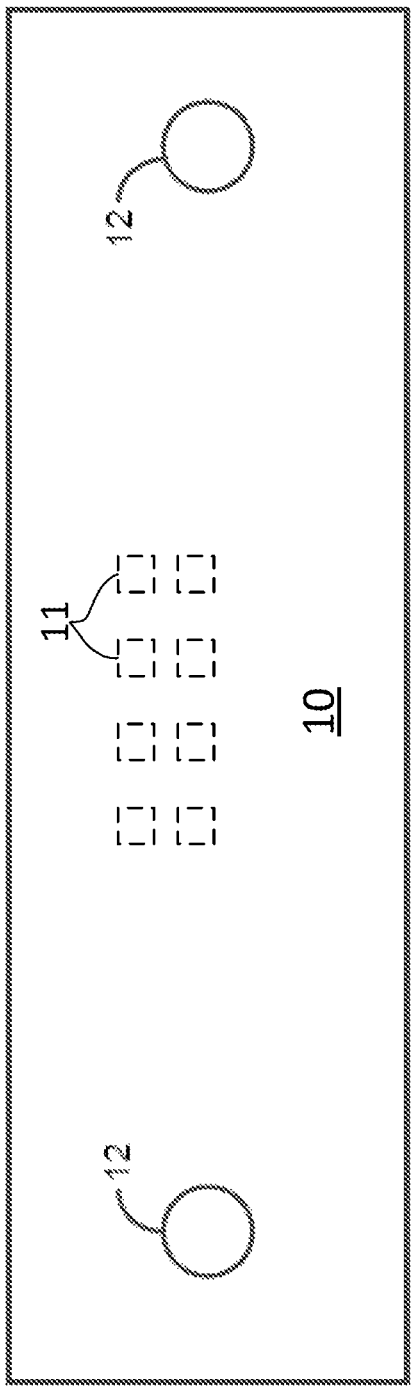

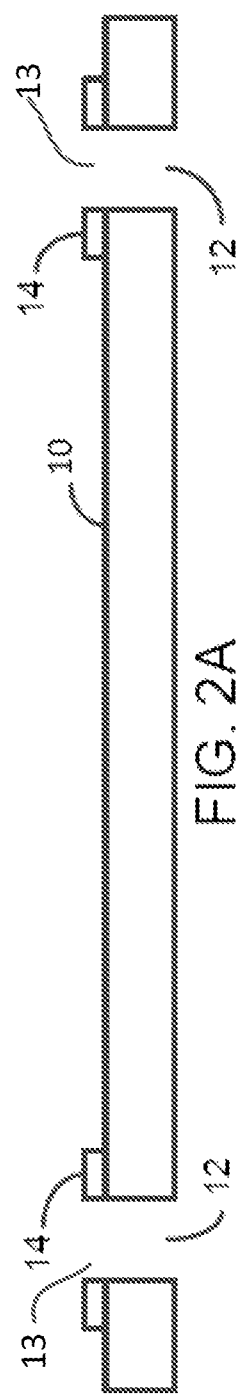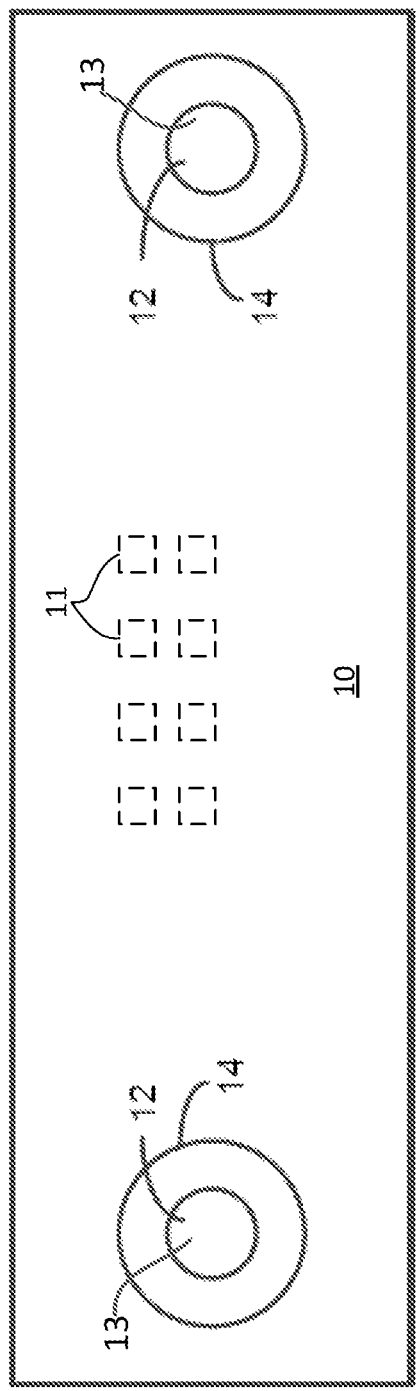

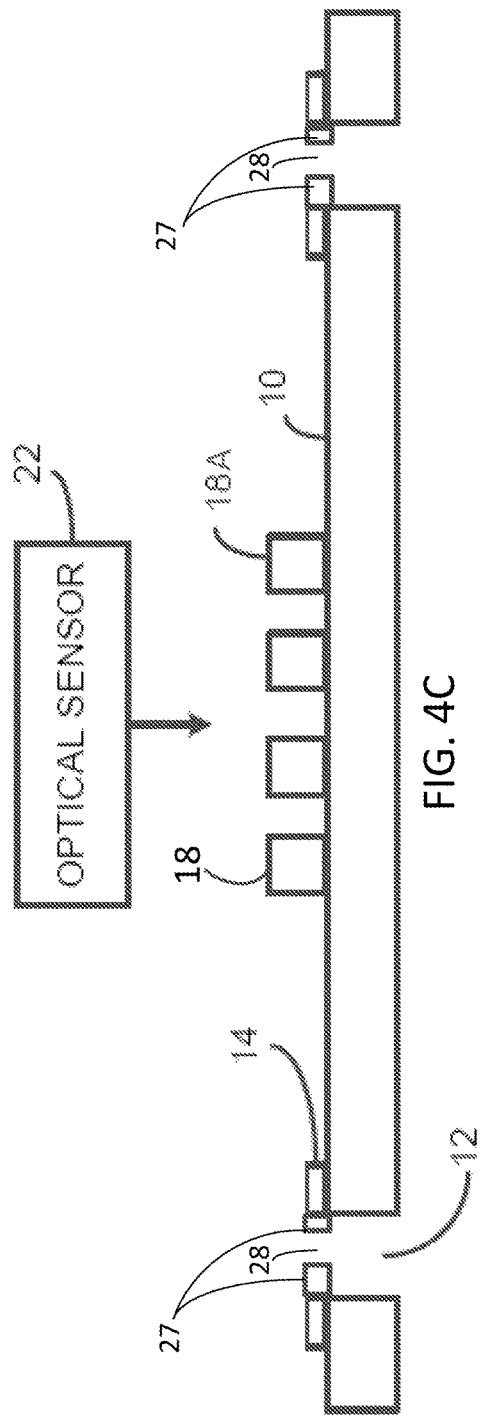
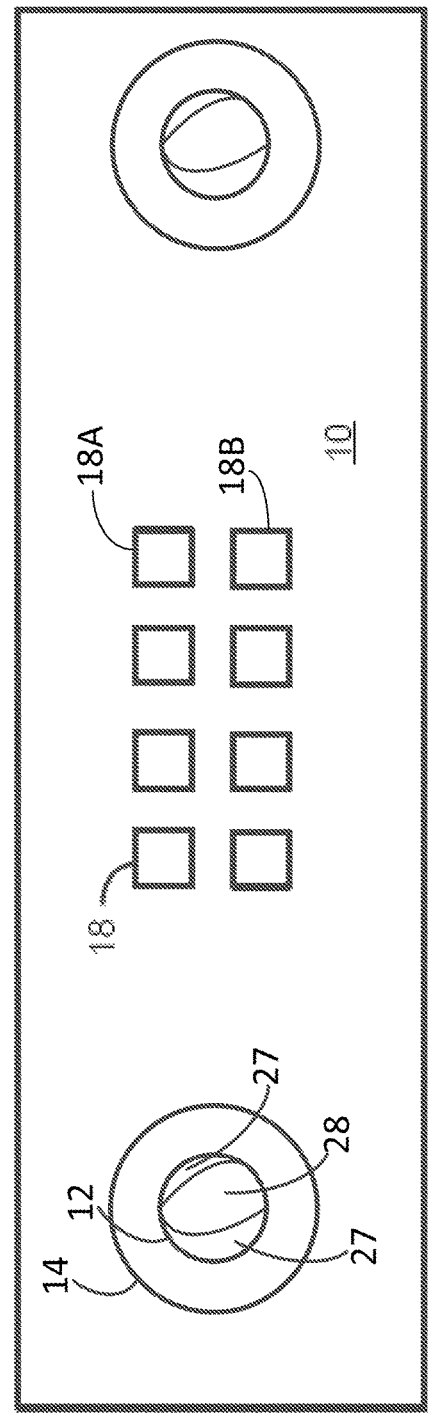

METHOD FOR ADDRESSING MISALIGNMENT OF LEDS ON A PRINTED CIRCUIT BOARD

CROSS REFERENCE TO RELATED APPLICATIONS

This application claims the benefit of U.S. Provisional Patent Application No. 62/437,593 filed on Dec. 21, 2016, which is incorporated by reference as if fully set forth herein.

BACKGROUND

Light emitting diodes (LEDs) are typically mounted on a printed circuit board (PCB), and the PCB is mounted on a support surface such as a heat sink or secondary optics. A PCB may typically include mounting holes or other features that enable the PCB to be aligned and mounted to a support surface.

Misalignment of the LEDs on the PCB can occur due to various process tolerances. Such misalignments can cause sub-optimal operational conditions as the light emitted from the LEDs may not optimally or efficiently reach secondary optics.

SUMMARY

The following description includes a method for forming an illumination system. A printed circuit board (PCB) with one or more alignment features for aligning the circuit board with a support surface may be provided. One or more light emitting diodes (LEDs) may be mounted on the PCB. A position of the one or more LEDs mounted on the PCB may be optically sensed and the one or more alignment features on the PCB may be modified based on the optically sensed position of the one or more LEDs. As a result, one or more modified alignment features may be formed on the PCB. The one or more modified alignment features may be used to align the PCB with secondary optics such that any misalignment of the LEDs on the PCB is offset by the modifications to the one or more alignment features on the printed circuit board.

The following description also includes an illumination system. A PCB may have one or more alignment features for aligning the PCB with a support surface. One or more LEDs may be mounted on the PCB and a modifying piece may be affixed to the one or more alignment features on the PCB that reduces the size of the one or more alignment features. As a result, one or more modified alignment features may be formed for offsetting any misalignment of the LEDs relative to the PCB. Secondary optics may be coupled to the PCB using the one or more modified alignment features to align the secondary optics to the PCB.

The following description includes a method for forming another illumination system. A printed circuit board (PCB) with one or more alignment features for aligning the circuit board with a support surface may be provided. One or more light emitting diodes (LEDs) may be mounted on the PCB via solder pads on the PCB metal interconnection pattern. A position of the metal interconnection pattern may be optically sensed and the one or more alignment features on the PCB may be modified based on the optically sensed position of the metal interconnection pattern. As a result, one or more modified alignment features may be formed on the PCB. The one or more modified alignment features may be used to align the PCB with secondary optics such that any misalignment of the metal interconnection pattern on the PCB is offset by the modifications to the one or more alignment features on the printed circuit board.

BRIEF DESCRIPTION OF THE DRAWINGS

A more detailed understanding may be had from the following description, given by way of example in conjunction with the accompanying drawings wherein:

FIG. 1A is a cross-sectional view of a PCB having enlarged mounting holes formed in it;

FIG. 1B is a top view of the PCB of FIG. 1A;

FIG. 2A is a cross-sectional view of the PCB of FIG. 1A having a metal film deposited around the mounting holes;

FIG. 2B is a top view of the PCB of FIG. 2A;

FIG. 4C is a cross-sectional view of a PCB, where the LEDs themselves are used as a fiducial for positioning a filling proximate to the mounting holes in the PCB, where the filling has a center hole smaller than the mounting holes;

FIG. 4D is a top view of the PCB of FIG. 4C;

DETAILED DESCRIPTION

Figure 3A:
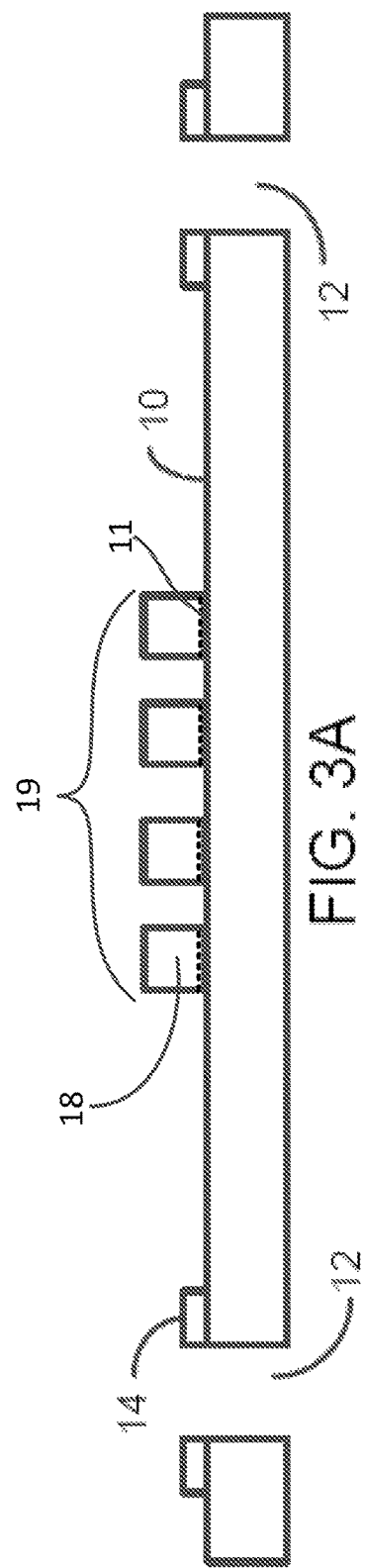
FIG. 3A is a cross-sectional view of the PCB of FIG. 2A having an array of LEDs mounted on it, where the LEDs are aligned with any fiducial on the PCB.

Examples of different light emitting diode ("LED") implementations will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The subject matter disclosed herein may be used in a wide variety of applications including any applicable LED device, array, system, or the like. Examples provided herein recite automobile headlights simply for illustrative purposes. The techniques disclosed herein including an alignment technique places an LED light source at a precise location relative to secondary optics, such as lens in a module, for optimal beam characteristics. Additional example applications include, but are not limited to, camera lighting, street lighting, television lighting, solar lighting, plant lighting, consumer goods lighting, or the like.

Conventional techniques to attach LEDs onto a PCB can result in misalignment of the LEDs on the PCB due to any number of reasons. For example, misalignment may occur in the X and Y directions due to process tolerances. Such misalignments may be in the range of 100 microns or greater. Further, such misalignment of the LEDs on the PCB gets added to any misalignment of the PCB on the support surface. In an automobile headlight application, for example, such cumulative misalignments result in non-ideal headlight beam characteristics.

According to the disclosed subject matter, LEDs for an illumination system may be mounted on a PCB and the PCB may be mounted on a support surface by, for example, nuts or screws which traverse through or are attached to the PCB and support surface. Any other mounting technique can be used that enables the PCB to be aligned with the support surface. The support surface and secondary optics may be part of a headlight module for an automobile. The secondary optics, such as a lens used for a headlight in an automobile, may operate optimally when precisely positioned relative to the LEDs mounted on a PCB.

As disclosed herein, a PCB may include alignment features such as mounting or alignment holes. These alignment features may be larger than corresponding holes or alignment pins in a support surface. An area surrounding the alignment features may be coated with a metal film which can be used for attaching a modifying component, such as a metal ring, to generate a modified alignment feature, such as a smaller opening, aligned based on a position of LEDs. For clarity, an alignment feature or modified alignment feature refers to a hole or space through which a component used to mount a PCB to a support surface, such as a bolt or pin, can be placed.

The LEDs may be mounted on the PCB using any applicable technique such as by soldering or ultrasonic welding and may be positioned using a fiducial on the PCB. The LEDs may be mounted to the PCB by being attached to solder pads that are arranged in a metal interconnection pattern on the PCB. A fiducial may be any type of reference. For example, a fiducial may be a hole or mark on the PCB, or may be the shape of the PCB itself. During the mounting, there may be inherent misalignment of the LEDs on the PCB due to process tolerances and movements of the LEDs during the mounting process.

A modified alignment feature may be created by a modifying component, such as a metal ring, with an opening that is smaller than the alignment feature (e.g., the mounting holes in a PCB). The modifying component may be optically aligned based on the position of the LEDs and positioned over a metal film deposited on the PCB and surrounding the PCB's mounting holes. The modifying component may be welded in place to the metal film by, for example, using a laser. Notably, the modified alignment feature corresponds to the opening of the modifying component, once it is attached to the metal film on the PCB. Based on the alignment with the LEDs, the smaller opening in the modifying component may be precisely positioned for mounting the PCB on a support surface such that any misalignment of the LEDs on the PCB are offset by the positioning of the smaller opening. The support surface may be a heat sink or, alternatively, the support surface may be a surface of the secondary optics in an illumination system. The smaller opening in the modifying component may be the same size as a screw hole or alignment pin in a support surface such that the positioning of the PCB will be precise, allowing the LEDs to align with secondary optics despite misalignment of the LEDs on the PCB.

According to the disclosed subject matter, an arrangement of LEDs may be precisely aligned with secondary optics to emit an optimized beam emission. Secondary optics may be any applicable optics that exist outside of an LED package such as reflector cavities, automobile headlights, camera lenses, Fresnel lenses, pillow lenses and the like. Such an optimal alignment may result in an alignment tolerance of less than 100 microns. By precisely aligning the PCB with a support surface and the secondary optics, based on the location of LEDs, an illumination system may exhibit its target characteristics.

FIG. 1A shows a cross-sectional view of a printed circuit board (PCB) 10 having alignment features such as oversized mounting holes 12 formed in it. The PCB 10 may be made from any applicable material including, but not limited to, aluminums, laminates, resin impregnated cloths, copper, or the like. The mounting holes 12 may be formed via any applicable manner such as by stamping or drilling. The mounting holes 12 may be spaced such that they can approximately be in alignment with mounting holes or alignment pins in a support surface (not shown in FIG. 1A). The mounting holes 12 may have a diameter that is wider than the mounting holes or alignment pins in the support surface (not shown in FIG. 1A). The PCB 10 may be a metal core with metal traces on its top surface along with solder pads, as shown in FIG. 1B, for connection to the LEDs and arranged in a metal interconnect pattern. The PCB 10 may have power supply terminals that are connected to wires via a suitable connector. In one example, the PCB may be a square with sides having a length of 5 cm.

FIG. 1B shows a top view of the PCB 10 of FIG. 1A. As shown, the mounting holes 12 on the PCB 10 are positioned such that the PCB 10 material surrounds the mounting holes 12. Although FIG. 1A and FIG. 1B show a rectangular PCB 10 and circular mounting holes 12, it will be understood that the PCB 10 may be any applicable shape and may be based on the application associated with the PCB 10. Similarly, the mounting holes 12 may be any shape. For example, the mounting holes 12 may be a non-circular shape. Solder pads 11 may be attached to the PCB 10 using any applicable application material such as an adhesive or may be soldered onto the PCB 10.

FIG. 2A shows a metal film 14 on the PCB 10 deposited around the mounting holes 12. The metal film 14 may be Kovar™, which is a nickel-cobalt ferrous alloy. Alternatively, the metal film 14 may be made in part or as whole of metals, such as copper, nickel, gold, and alloys, or the like. The metal film 14 may be welded, soldered or glued to a metal ring, as disclosed herein. The metal film 14 may be deposited using any applicable process such as screen-printing or the like. As shown, the metal film 14 may have a center opening 13 substantially equal in size as the mounting holes 12 in the PCB 10. The metal film 14 may be a pre-formed washer and may be affixed to the PCB 10, such that the center opening 14 of the washer is approximately the size of the mounting holes 12 in the PCB 10.

FIG. 2B is a top view of the PCB 10 of FIG. 2A. As shown, the metal film 14 is placed on the PCB 10 such that a center opening 13 in the metal film 14 is aligned with the mounting holes 12. Although FIG. 2B shows a circular opening 13 in metal film 14, it will be understood that the center opening 13 in metal film 14 may not be circular and may correspond to the shape of a mounting hole 12. Solder pads 11 may be attached to the PCB 10 and arranged in a metal interconnect pattern that facilitates electronic connections of LEDs placed on the solder pads to electrical components.

FIG. 3A illustrates an array of LEDs 19 including individual LEDs 18 soldered or welded to the solder pads 11 on the surface of the PCB 10. The array of LEDs 19 may be positioned onto the solder pads 11 on the surface of the PCB 10 using a programmed mounting tool that aligns each LED 18 to its associated mounting pad and solders or welds the electrodes of the LEDs 18 to the respective solder pads 11 on the surface of the PCB 10. The LEDs 18 may be optically aligned with any type of fiducial on the PCB 10, such as marks, holes, the solder pads themselves, the shape of the PCB 10, or the like. The aligning tool may use physical contact with a fiducial, such as a corner of the PCB 10, to align the LEDs 18. Such an alignment process may have a tolerance of 100 microns, which adds to the alignment tolerances of other alignments in the system. Additionally, the LEDs 18 may shift during a solder reflow process. Additionally, the solder pads 11 on the PCB 10 may not be precisely aligned with any fiducials on the PCB 10, which may add to the LEDs' misalignment on the PCB 10. Such a solder pad misalignment may be, for example, +/−125 microns. Based on the number and frequency of misalignments, the LEDs 18 may have a position tolerance in excess of +/−200 microns on the PCB 10. The alignment tool may align the LEDs 18 using the same fiducial. Accordingly, it should be noted that the alignment of the LEDs 18 with respect to the each other may be accurate as a result of the alignment tool aligning the LEDs 18 to the same fiducial such that all the LEDs 18 are treated the same, relatively.

Figure 3B:
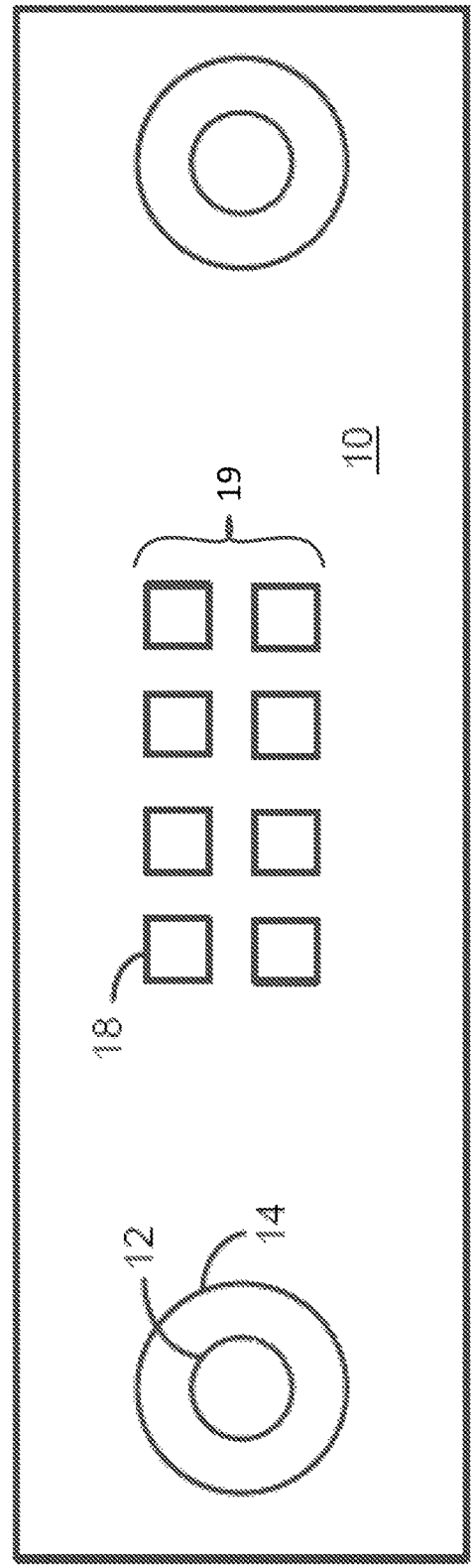
FIG. 3B is a top view of the PCB of FIG. 3A.

FIG. 3B shows a top view of the PCB 10 of FIG. 3A. Although a rectangular array 19 of LEDs 18 is shown, the array may be any shape. For example, the array may be circular or other shape based on the application.

As further disclosed herein, the alignment features (e.g., holes) in the PCB may be reduced in size by using a modifying component to create modified alignment features that are smaller than the alignment features. The position of the modified alignment features may be determined by using one or more LEDs as a fiducial, such that the position of the modified alignment features enables precise alignment of the PCB with a support surface. The modifying component may be a metal ring as shown in FIG. 4A and FIG. 4B, a filling as shown in FIGS. 4C and 4D, or the like.

Figure 4A:
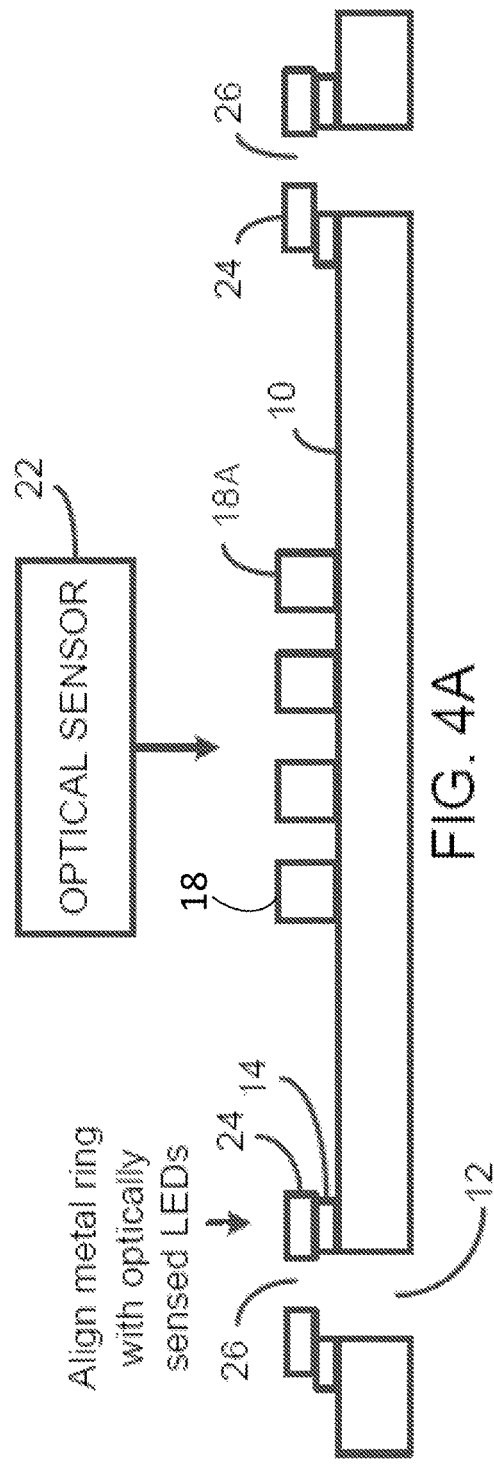
FIG. 4A is a cross-sectional view of the PCB of FIG. 3A, where the LEDs themselves are used as a fiducial for positioning a metal ring over the mounting holes in the PCB, where the metal ring has a center hole smaller than the mounting holes and the metal ring is welded to the metal film.
Figure 4B:
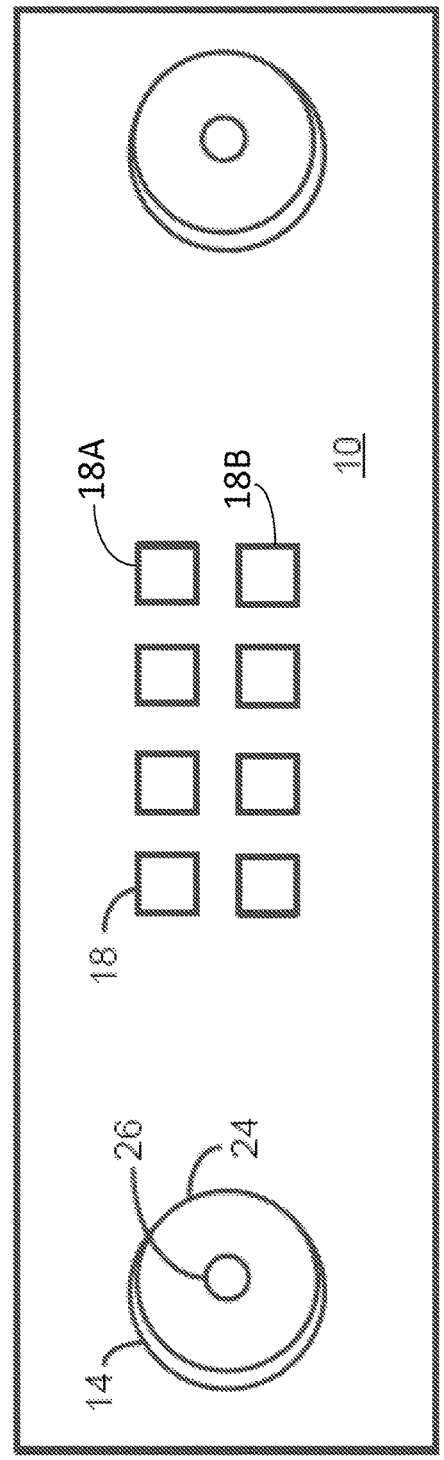
FIG. 4B is a top view of the PCB of FIG. 4A.

FIG. 4A shows an optical sensor 22 configured to sense the position of one or more LEDs 18 such that the one or more LEDs 18 act as a fiducial for the alignment of a modified component such as a pre-formed metal ring 24 (e.g., a washer) over the metal film 14. As an example, an LED 18A may be used as a fiducial such that the optical sensor 22 may align a metal ring 24 based on the position of the LED 18A. More specifically, as an example, the metal ring 24 may be aligned based on the location of a corner of the LED 18A. As another example, an LED 18A and an LED 18B may together be used as a fiducial such that optical sensor 22 may align a metal ring 24 based on the position of LEDs A and B. As a specific example, the median point between corners of LED 18A and LED 18B may act as a fiducial to align metal ring 24.

The metal ring 24 may contain a center hole 26 that is smaller than the mounting holes 12 in the PCB 10. As stated herein, the center hole 26 may be aligned based on one or more of the LEDs 18 instead of a fiducial on the PCB 10. Thus, any misalignment of the LEDs 18 with respect to the PCB 10 may be rendered irrelevant as the alignment of metal ring 24 is based only on the LEDs. The reason the misalignment of the LEDs 18 with respect to the PCB 10 may be rendered irrelevant is because the tolerance conditions for an illumination system may rely on aligning the LEDs 18 with a support surface, and not the PCB with a support surface. Accordingly, the misalignment of LEDs 18 on PCB 10 would be relevant only if the position of the PCB 10 was then aligned with a support surface. By aligning the metal ring 24 based on the LEDs 18, any misalignment of the LEDs 18 with the PCB 10 would be offset. In one implementation, the center point of the metal ring 24 is optically aligned with the furthest LED 18A or 18B, as it may be assumed that the furthest LED is the most misaligned with respect to the mounting hole 12.

The metal ring 24 may be welded to the metal film 14 by heating the metal ring 24 with a laser to mitigate shifting of the metal ring 24. The metal ring 24 may have a bottom surface that can easily weld to the metal film 14, such as Kovar™ with a Ni coating.

The center hole 26 in the metal ring 24 may be approximately the same diameter as a mounting hole or alignment pin in a support surface, as further described herein. As shown in FIGS. 4A and 4B, the center hole 26 of the metal ring 24 may not align exactly with the center of the mounting hole 12 in the PCB 10, such that the offset is approximately equal to the misalignment of the LEDs 18 with respect to the PCB 10 The positional accuracy of the metal ring 24 may be +/−25 microns.

FIG. 4B is a top view of the PCB of FIG. 4A which includes a modifying component, metal ring 24. As shown, the center hole 26 of the metal ring 24 does not align with the center of the mounting hole 12 in the PCB 10.

It should be noted that a metal film 14 need not be used such that the metal ring 24 may be directly affixed to the PCB 10 via tape, solder, epoxy, or other means. However, use of the metal film 14 may provide an efficient option for some applications as a result of the raised film and/or as a result of the material used for the metal film 14.

FIG. 4C shows an optical sensor 22 configured to sense the position of one or more LEDs 18 such that the one or more LEDs 18 act as a fiducial for the alignment of a modifying component such as adjustment fill 27. As an example, an LED 18A may be used as a fiducial such that the optical sensor 22 may align adjustment fill 27 based on the position of the LED 18A. More specifically, as an example, the adjustment fill 27 may be aligned based on the location of a corner of the LED 18A. As another example, LED 18A and an LED 18B, as shown in FIG. 4C and FIG. 4D may together be used as a fiducial such that optical sensor 22 may align an adjustment fill 27 based on the position of LEDs A and B. As an example, the median point between corners of LED 18A and LED 18B may act as a fiducial to adjustment fill 27.

The adjustment fill 27 may create a center hole 28 that is smaller than the mounting hole 12 in the PCB 10. As stated herein, the center hole 28 may be aligned based on one or more of the LEDs 18 instead of a fiducial on the PCB 10. Thus, any misalignment of the LEDs 18 with respect to the PCB 10 may be rendered irrelevant as the alignment of adjustment fill 27 is based only on the LEDs. The reason the misalignment of the LEDs 18 with respect to the PCB 10 may be rendered irrelevant is because the tolerance conditions for an illumination system may rely on aligning the LEDs 18 with a support surface, and not the PCB with a support surface. Accordingly, the misalignment of LEDs 18 on PCB 10 would be relevant only if the position of the PCB 10 was then aligned with a support surface. By aligning the adjustment fill 27 based on the LEDs 18, any misalignment of the LEDs 18 with the PCB 10 would be offset. In one implementation, the center point of the adjustment fill 27 is optically aligned with the furthest LED 18A or 18B, as it may be assumed that the furthest LED is the most misaligned with respect to the mounting hole 12.

The adjustment fill 27 may be deposited onto the metal film 14 and attached onto the metal film 14 via any applicable technique such as welding, using an adhesive, soldering, or the like. The center hole 28 created by the adjustment fill 27 may be approximately the same diameter as a mounting hole or alignment pin in a support surface, as further described herein. As shown in FIGS. 4C and 4D, the center hole 28 created by the adjustment fill 27 may not align exactly with the center of the mounting hole 12 in the PCB 10, such that the offset is approximately equal to the misalignment of the LEDs 18 with respect to the PCB 10 The positional accuracy of the adjustment fill 27 may be +/−25 microns.

FIG. 4D is a top view of the PCB of FIG. 4A which includes a modifying component, adjustment fill 27. As shown, the center hole 28 of the adjustment fill 27 reduces the space made available by mounting hole 12 in the PCB 10.

It should be noted that a metal film 14 need not be used such that the adjustment fill 27 may be directly affixed to the PCB 10 via tape, solder, epoxy, or other means. As an example, the adjustment fill 27 may be attached directly within mounting hole 12. However, use of the metal film 14 may provide an efficient option for some applications as a result of the advantages provided by the easy of application to the metal film 14 or of the material used for the metal film 14.

According to an implementation, LEDs 18 are may be precisely positioned on their respective solder pads on the PCB 10. The solder pads may be arranged in a metal interconnect pattern that enables LEDs 18 placed on the solder pads to be connected to electronic components. In such a configuration, the fiducial for positioning a modifying component such as the metal ring 24 or adjustment fill 27 may be the solder pads for the PCB 10 or any other feature of the solder pad pattern. Because the LEDs 18 in this configuration are precisely positioned on the respective solder pads, using the solder pads as the fiducial for the modified alignment feature can provide the same result as aligning the modified alignment feature based on the LEDs 18. Accordingly, in such a precisely positioned LED configuration, aligning the modified alignment feature based on the solder pads may render any misalignment between the solder pads and PCB 10 irrelevant.

Figure 5:
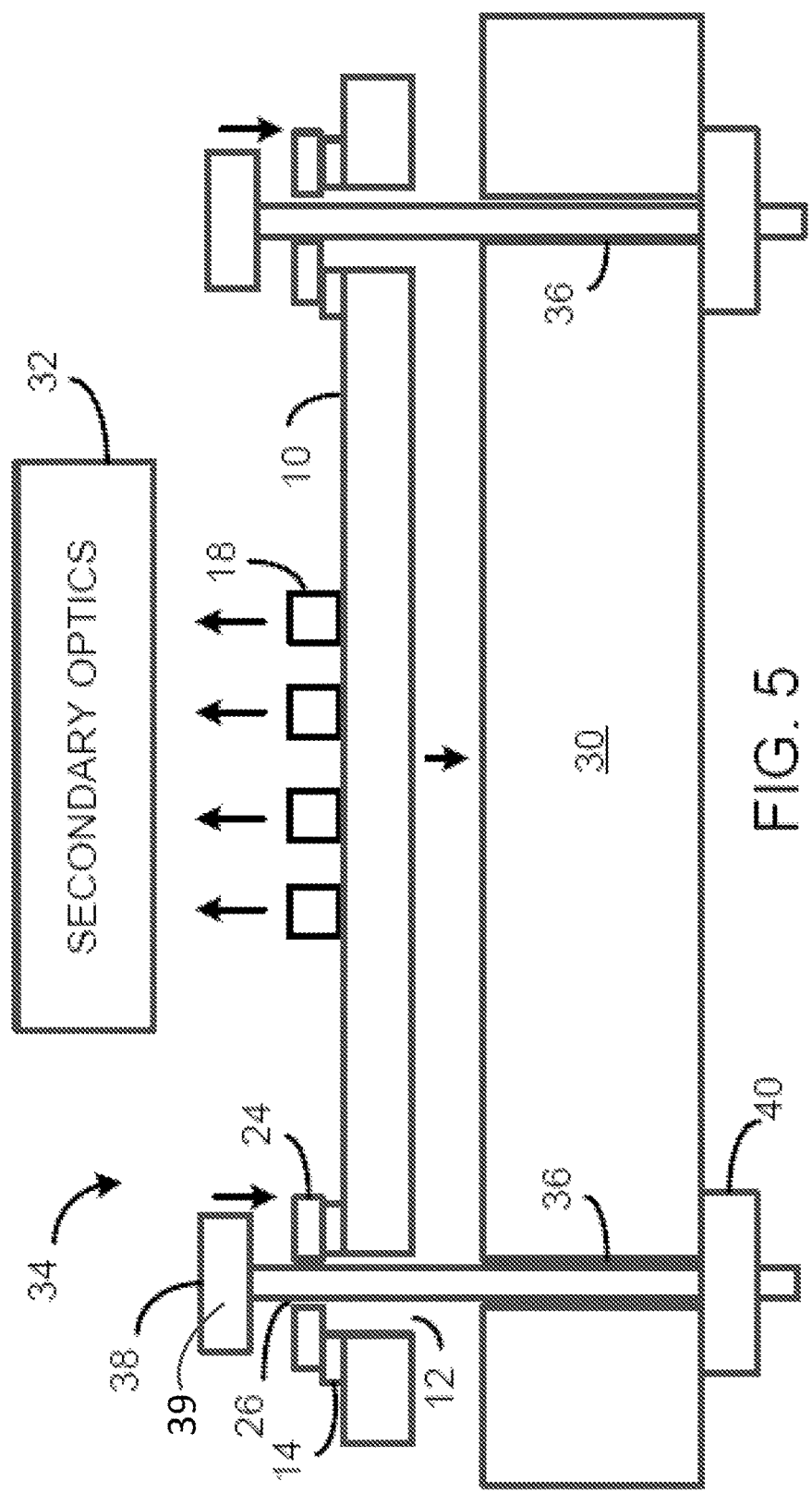
FIG. 5 is a cross-sectional view of the PCB of FIG. 4A being mounted on a support surface, where secondary optics are aligned with the support surface in a headlight module of an automobile and the center holes of the metal rings are used to position the PCB with respect to the support surface.

FIG. 5 illustrates an illumination system 34 based on the subject matter disclosed herein. As an example, the illumination system 34 may a headlight module. The PCB 10 of FIG. 4A may be mounted on a support surface 30 such as a heat sink. The support surface 30 and the secondary optics 32 may be attached, connected, or otherwise associated such that aligning an LED array to either the support surface 30 or the secondary optics 32 also results in an alignment with the other. The support surface 30 and secondary optics 32 may be connected by the housing (not shown) that holds both the support surface 30 and secondary optics 32. Alternately, the support surface 30 may be part of the secondary optics 32 or may be connected directly to the secondary optics 32 via a connector such as via a metal connector, a screw, a clamp, or the like.

The mounting holes 36 in the support surface 30 may have the same diameter as the modified alignment features created by the center holes 26 of metal rings 24. It should be noted that the mounting holes 36 may be alignment pins or tabs or any other alignment feature. A bolt 38, having a rod with a diameter approximately equal to the diameter of the mounting holes 36 and center holes 26 of the metal rings 24, may be used to secure the PCB 10 to the support surface 30. As shown in FIG. 5, the bolt 38 may have a top portion 39 that is larger than the diameter of the rod, although such a top portion is not required. A nut 40 may be used for fastening the bolt 38 to the support surface 30. Alternatively, instead of a nut 40, the heat sink mounting holes 36 may be threaded, which may allow the bolt 38 to screw into the mounting holes 36. Alternatively, the bolt 38 may represent a fixed alignment pin extending from the support surface 30 and configured to attach to the PCB 10 via the metal rings 24. Overall, the support surface 30 may be attached to the PCB 10 in any manner while maintaining the alignment described herein.

Accordingly, using the techniques described herein, the LEDs 18 can be precisely aligned with the support surface 30 and, thus, may precisely align with the secondary optics 32 in the X-axis and Y-axis despite any misalignment of the LEDs 18 relative to the PCB 10.

According to an implementation, the LEDs 18 may be positioned at a focal point of the secondary optics 32, and the secondary optics 32 may create a beam with the desired characteristics for a given illumination system. In the example of an automobile headlight system, both headlights of a vehicle can be made to have identical beams or slightly different beams.

Although bolt 38 is shown to secure the PCB 10 to support surface 30 in FIG. 5, any applicable securing mechanism to secure the PCB 10 to support surface 30 may be used, so long as the position of mounted LEDs 18 is used to align the securing mechanism.

As an alternative to using actual LEDs 18 to align modified alignment feature, a related fiducial such as one or more tabs, notches, slits, or the like, that is created or adjusted after the mounting of the LEDs 18 to the PCB 10 may be used to align the securing mechanism. Note that the position of the related fiducial is based on the LEDs 18 such that although the related fiducial may be used to conduct the alignment, the alignment is still based on the LEDs 18. For example, a notch on a PCB side that is used as a fiducial for aligning the PCB to the support surface may initially be oversized. After the LEDs are mounted on the PCB, an alignment piece may be welded to the PCB that closes up the notch slightly to align the narrowed notch to the actual locations of the LEDs. The narrowed notch may then be used as the fiducial for aligning the modified alignment feature. The related fiducial may be rectangular or any other shape and may be made of metal or any other applicable material.

According to an implementation, the support surface may be part of or attached to the secondary optics such that the secondary optics can be directly attached to the PCB 10 rather being attached to the PCB 10 via a heat sink or a housing. The secondary optics 32 may have pins, bolts, or other connection/alignment features that directly attach to the PCB 10 via the modified alignment feature (e.g., a metal ring 24 with center holes 26) on the PCB 10. Therefore, the modified alignment feature may cause the secondary optics to be precisely aligned with the LEDs 18. Notably, the modified alignment feature may allow either a support surface/secondary optics combination, as previously discussed, or secondary optics to align based on the position of the LEDs 18 rather than the PCB 10.

Figure 6:
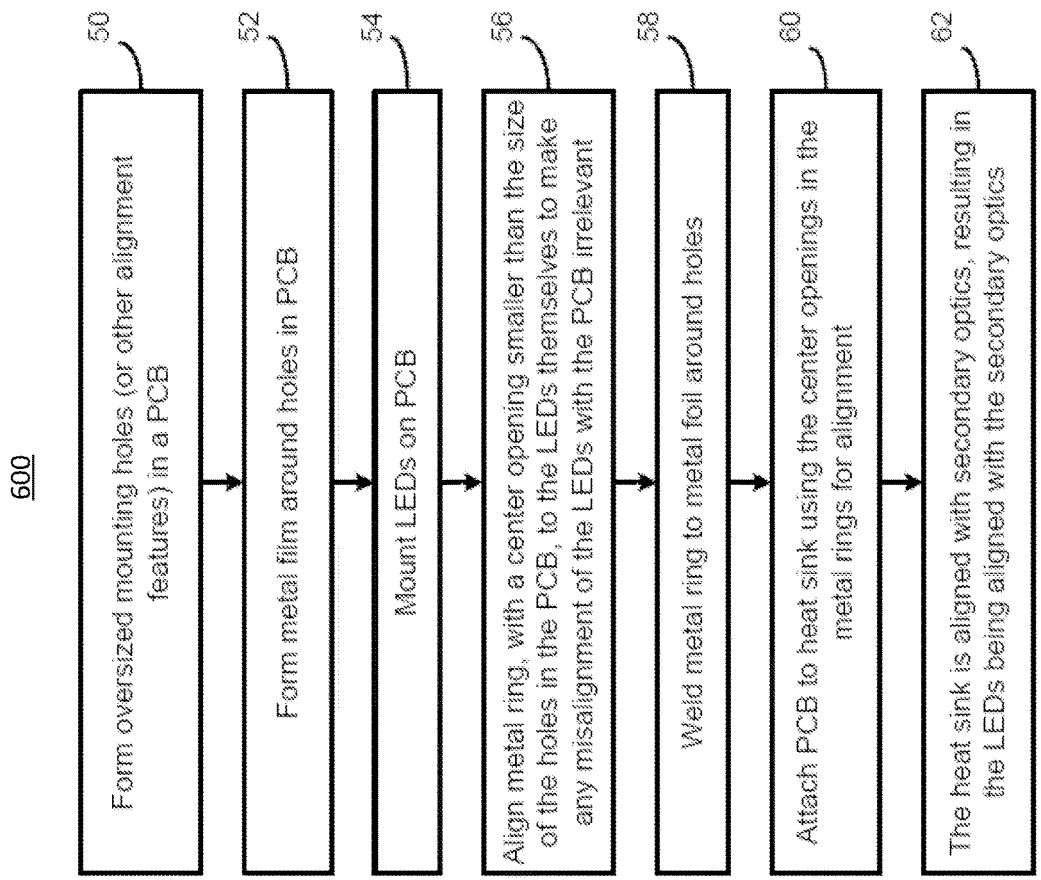
FIG. 6 is a flowchart of the method used to fabricate the headlight module of FIG. 5.

FIG. 6 is a flowchart of a process 600 used to fabricate the illumination system of FIG. 5. As shown, at step 50, oversized holes or other alignment features may be formed in a PCB. The holes may be circular or any other applicable shape.

At step 52, a metal film may be formed around the holes in the PCB. The metal film may facilitate welding components onto the metal film more efficiently than directly affixing such components onto the PCB. However, it should be noted that a modifying component, as disclosed herein, may be directly affixed to the PCB using applicable measures that mitigate shifting of the modifying component.

At step 54, LEDs may be mounted on the PCB using any fiducial on the PCB for aligning the LEDs with the PCB. Metal traces forming a metal interconnection pattern on the PCB may interconnect the LEDs and connect them to power supply terminals. A mounting tool may be used to mount the LEDs onto pads on the PCB.

At step 56, modifying components such as metal rings may be provided that include a center opening that is smaller than the alignment features formed in the PCB. The center opening may have the same diameter as a mounting hole or an alignment pin on a support surface. The center points of the modifying components may be positioned based on aligning with the LEDs themselves or, for example, with solder pads arranged in a metal interconnection pattern. As an example, a metal ring may be aligned with an LED that is furthest away from the metal ring as that LED may be presumed to be the most misaligned with respect to the oversized hole in the PCB. Solder pads may be arranged in a metal interconnection pattern and, as disclosed herein, a modifying component may be aligned based on the metal interconnection pattern if the LEDs are precisely placed on the solder pads.

At step 58, the metal ring may be welded to the metal film on the PCB by a laser. As disclosed herein, if a metal film is not used, then a modifying component, such as a metal ring, may be affixed directly to the PCB.

At step 60, the PCB may be attached to a support surface using the metal ring's center openings for alignment, such as by inserting a bolt or alignment pin through the center opening. The bolt may be fastened using a nut or may be screwed into the housing of, for example, the support surface.

At step 62, secondary optics such as lenses may be aligned with the support surface. The alignment may be caused by the support surface and secondary optics being contained in the same housing. Alternatively, the alignment of the secondary optics with the support surface may be a result of attaching the secondary optics to the support surface via any applicable mounting techniques.

Notably, based on the techniques disclosed herein, LEDs on a PCB may be XY aligned with respect to the secondary optics in a high precision manner, such that the misalignment is within a +/−25 micron range Such an alignment may result in optimal beam characteristics.

While particular embodiments or implementations of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method comprising:
   mounting one or more light emitting diodes (LEDs) on a printed circuit board, the printed circuit board having a first alignment feature;
   optically sensing a position of the one or more LEDs mounted on the printed circuit board;
   modifying the first alignment feature on the printed circuit board, based on the optical sensing of the position of the one or more LEDs, to form a modified alignment feature on the printed circuit board that modifies the space made available by the first alignment feature; and
   aligning secondary optics with the one or more LEDs by mounting the printed circuit board on a support surface using the modified alignment feature such that a misalignment of the LEDs on the printed circuit board is offset by the modified alignment feature.

2. The method of claim 1 wherein the first alignment feature on the printed circuit board is an oversized hole and modifying the first alignment feature comprises reducing a space made available by the oversized hole by adding an adjustment fill to the oversized hole.

3. The method of claim 1 further comprising:
   affixing a metal film proximate to the first alignment feature;

aligning a pre-formed metal ring comprising a hole smaller than the space created by the first alignment feature over the metal film based on the position of the one or more LEDs; and affixing the metal ring to the metal film based on the aligning, to form the modified alignment feature.

4. The method of claim 1 wherein the secondary optics are attached to the support surface.

5. The method of claim 1 wherein the support surface comprises a first opening, and further comprising mounting the printed circuit board to the support surface with a bolt through the modified alignment feature and the first opening.

6. The method of claim 1 wherein the support surface comprises an alignment pin protruding from the support surface and further comprising mounting the printed circuit board to the support surface by placing the alignment pin through the modified alignment feature.

7. The method of claim 1 wherein the support surface is a heat sink forming part of a housing, wherein the housing aligns the heat sink with secondary optics.

8. The method of claim 1 wherein the support surface is part of the secondary optics.

9. An illumination system comprising:
a printed circuit board having a first alignment feature;
one or more light emitting diodes (LEDs) mounted on the printed circuit board;
a modifying component affixed to the first alignment feature to form a modified alignment feature that reduces a space made available by the first alignment feature, the position of the modified alignment feature based on a position of the one or more LEDs; and
secondary optics coupled to the printed circuit board using the modified alignment feature such that any misalignment of the LEDs on the printed circuit board is offset by the position of the modified alignment feature.

10. The system of claim 9 further comprising a support surface wherein the secondary optics is attached to a support surface and the printed circuit board is mounted on the support surface by aligning the modified alignment feature with a second alignment feature on the support surface selected from one of an opening and an alignment pin.

11. The system of claim 9 wherein the modifying component comprises a metal ring further comprising:
a metal film proximate to the first alignment feature, the metal film comprising an opening larger than the first alignment feature; and
the metal ring affixed to the metal film to form the modified alignment feature, the metal ring comprising an opening smaller than the first alignment feature.

12. The system of claim 9 wherein the modifying component comprises an adjustment fill.

13. The system of claim 9 wherein the modified alignment feature is aligned with a second alignment feature on a support surface attached to the secondary optics.

14. The system of claim 13 wherein the second alignment feature comprises an opening in the support surface, the system further comprising a bolt affixing the printed circuit board to the support surface by being inserted through the modified alignment feature and the second alignment feature.

15. The system of claim 13 wherein the second alignment feature comprises an alignment pin protruding from the support surface.

16. The system of claim 9 wherein the secondary optics and a support surface are attached to a housing.

17. A method for forming an illumination system comprising:
providing a printed circuit board having a first alignment feature, the printed circuit board having a metal interconnection pattern;
mounting one or more light emitting diodes (LEDs) on the printed circuit board via the metal interconnect pattern;
optically sensing the metal interconnection pattern;
modifying the first alignment feature on the printed circuit board, based on results of the optical sensing of the metal interconnection pattern, to form a modified alignment feature on the printed circuit board; and
aligning the printed circuit board with a support surface using the modified alignment feature such that any misalignment of the metal interconnection pattern on the printed circuit board is offset by the modified alignment feature.

18. The method of claim 17 wherein the first alignment feature comprises an oversized hole and modifying the first alignment feature comprises reducing a size of the oversized hole.

19. The method of claim 17 further comprising:
affixing a metal film proximate to the first alignment feature;
aligning a pre-formed metal ring comprising a first opening, smaller than the space created by the first alignment feature, with the metal interconnection pattern as a result of the optically sensing the metal interconnection pattern; and
affixing the metal ring to the metal film based on the aligning, to form the modified alignment feature such that the step of aligning the printed circuit board to the support surface comprises aligning the first opening to a second alignment feature on a support surface.

20. The method of claim 17 wherein a secondary optics is attached to the support surface and the modified alignment feature is aligned with one or more second alignment features on the support surface.

* * * * *